US011303310B2

(12) United States Patent
Meilhac et al.

(10) Patent No.: US 11,303,310 B2
(45) Date of Patent: Apr. 12, 2022

(54) DIGITAL PRE-DISTORTION METHOD FOR OFDM-BASED COMMUNICATION SYSTEMS

(71) Applicant: RIVIERAWAVES, Biot (FR)

(72) Inventors: Lisa Meilhac, Valbonne (FR); Ahmad Bazzi, Nice (FR)

(73) Assignee: RIVIERA WAVES SAS, Biot (FR)

( * ) Notice: Subject to any disclaimer, the term of this patent is extended or adjusted under 35 U.S.C. 154(b) by 0 days.

(21) Appl. No.: 16/951,554

(22) Filed: Nov. 18, 2020

(65) Prior Publication Data

US 2021/0152199 A1 May 20, 2021

(30) Foreign Application Priority Data

Nov. 19, 2019 (EP) ..................................... 19315136

(51) Int. Cl.
*H04L 27/26* (2006.01)
*H04B 1/04* (2006.01)

(52) U.S. Cl.
CPC ....... *H04B 1/0475* (2013.01); *H04L 27/2626* (2013.01); *H04B 2001/0425* (2013.01)

(58) Field of Classification Search
CPC ............. H04L 27/2614; H04L 27/2626; H04L 27/367; H04L 27/3411; H04L 1/0475; H04B 1/04; H04B 2001/0425
USPC .......................................... 375/295–297, 260
See application file for complete search history.

(56) References Cited

U.S. PATENT DOCUMENTS

| | | | |
|---|---|---|---|
| 9,780,985 B1 | 10/2017 | Tom et al. | |
| 2003/0147655 A1 | 8/2003 | Shattil | |
| 2008/0211576 A1* | 9/2008 | Moffatt | H03F 1/3294 330/149 |
| 2012/0119831 A1* | 5/2012 | Bai | H03F 1/3247 330/149 |
| 2014/0056385 A1* | 2/2014 | Terry | H04L 27/2626 375/316 |
| 2014/0348263 A1* | 11/2014 | Rollins | H03F 3/24 375/297 |

(Continued)

FOREIGN PATENT DOCUMENTS

| | | |
|---|---|---|
| EP | 1679849 A1 | 7/2006 |
| EP | 2109227 A1 | 10/2009 |

(Continued)

OTHER PUBLICATIONS

Cepeda et al., R. "Rate-lossless PAPR reduction in per-subcarrier antenna selection OFDM systems," pp. 1-13, Physical Communication (2013), http://dx.doi.org/10.1016/j.phycom.2013.03.004.

(Continued)

*Primary Examiner* — Emmanuel Bayard
(74) *Attorney, Agent, or Firm* — Hauptman Ham, LLP

(57) ABSTRACT

It is provided a method designed, for OFDM-based communication systems, to slightly modify the signal to be emitted before the power amplifier input of the transmitter. The guiding idea is that the minimal IBO value for which the slightly modified signal still fulfills the standard requirements is inferior to the smallest IBO value for which the transmitted signal still meets the standard requirements in terms of EVM and spectral mask without implementing the proposed method.

16 Claims, 11 Drawing Sheets

(56) References Cited

U.S. PATENT DOCUMENTS

| | | | | |
|---|---|---|---|---|
| 2015/0146806 A1* | 5/2015 | Terry | ............... | H04L 27/2624 375/260 |
| 2016/0006464 A1* | 1/2016 | Stadelmeier | ......... | H04B 1/0475 375/296 |
| 2016/0080051 A1* | 3/2016 | Sajadieh | ............. | H04B 7/0452 375/267 |
| 2016/0182099 A1* | 6/2016 | Boddupally | ............. | H03F 3/21 375/296 |
| 2016/0191290 A1* | 6/2016 | Kim | ................ | H04L 27/2649 375/295 |
| 2017/0288927 A1 | 10/2017 | Engin et al. | | |
| 2019/0312649 A1* | 10/2019 | Spyropoulos | ........ | H04B 1/0475 |

FOREIGN PATENT DOCUMENTS

| | | |
|---|---|---|
| EP | 2541860 A2 | 1/2013 |
| KR | 20100039901 A | 4/2010 |
| WO | 2004043028 A1 | 5/2004 |

OTHER PUBLICATIONS

Selim et al., A. "Real-Time Sidelobe Suppression for OFDM Systems Using Advanced Subcarrier Weighting," pp. 4043-4047, IEEE Wireless Communications and Networking Conference (2013).

Aggarwal, A. (2006) Minimizing the Peak-to-Average Power Ratio of OFDM Signals Using Convex Optimization, vol. 54, No. 8, 3099-3110.

Sezginer, S. (2007) Metric-Based Symbol Predistortion Techniques for Peak Power Reduction in OFDM Systems, vol. 3, No. 7, 2622-2629.

Cepeda, R. (2013) Rate-lossless PAPR reduction in per-subcarrier antenna selection OFDM systems, vol. 9, pp. 112-124.

Selim, A. (2013) Real-time sidelobe suppression for OFDM systems using advanced subcarrier weighting.

Extended European Search Report issued in corresponding European Application No. 19315136.2, dated May 27, 2020, pp. 1-8, European Patent Office, Munich, Germany.

* cited by examiner

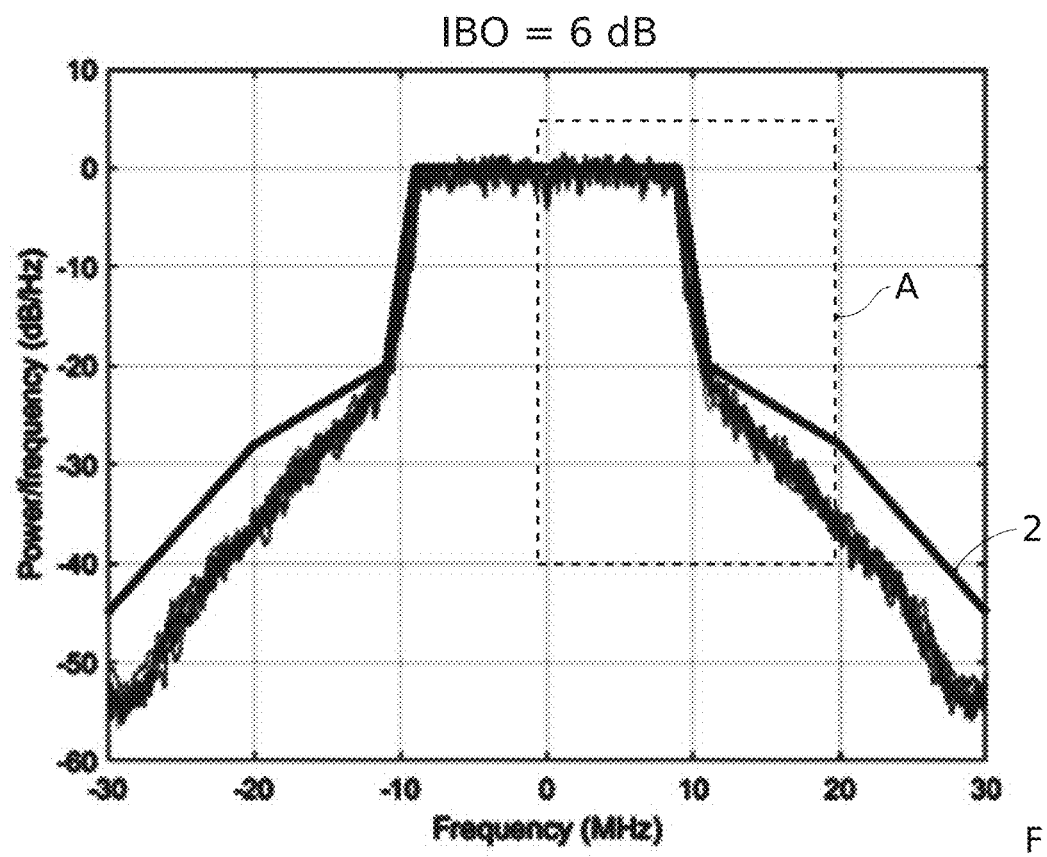
FIG. 11A
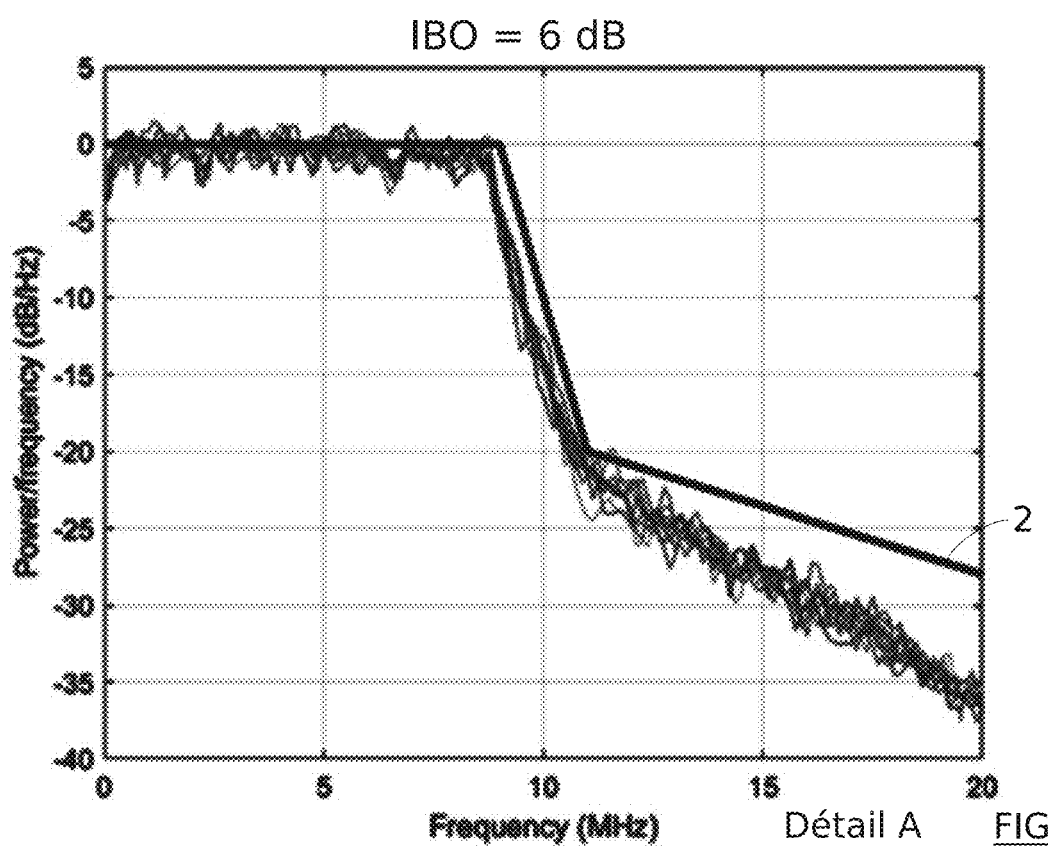
Détail A   FIG. 11B

DIGITAL PRE-DISTORTION METHOD FOR OFDM-BASED COMMUNICATION SYSTEMS

FIELD OF THE INVENTION

The present invention generally relates to Orthogonal Frequency-Division Multiplexing (OFDM)-based communication systems. The invention relates more specifically to a digital pre-distortion method for OFDM-based communication system.

BACKGROUND OF THE INVENTION

A WiFi modem transmitter uses a power amplifier (PA) as RF component which converts a low power radio signal to a higher power radio signal, thus leading to an increase in signal coverage area.

Power Amplifiers (PAs) are indispensable components in an OFDM-based communication system, but they are also major contributors to power supply requirements, heat management requirements, equipment size and, hence, cost of the system.

Thus, it is very important to optimize PA's efficiency at the transmission side of the OFDM-based communication system. However, PAs are inherently nonlinear and then inefficient for transmission of signals with large fluctuations of their power envelope.

FIG. 1 highlights the nonlinear response of PA. In order to combat non-linearity, PA shall be used far from its ideal operated point, allowing its nominal, i.e. linear, operation. This is particularly critical for transmission of signal formats, such as OFDM, having large Peak-to-Average Power Ratios (PAPRs). In this case, the Input Back Off (IBO) power must generally be very large. This shows the efficiency/linearity duality and the fact that their trade-off is a critical design issue in OFDM-based communication systems. Said differently, there exists a 'push-pull constrained' problem to be solved. More particularly, there exists a need of finding a way to increase PA efficiency of the transmitter and decrease the so-called Error Vector Magnitude (EVM) at the transmitter output, while abiding spectral mask requirement.

From the scientific publication of Sezginet et al., "Metric-based symbol predistortion techniques for peak power reduction in OFDM systems," IEEE Trans. Wireless Commun., vol. 6, no. 7, pp. 2622-2629, July 2007, three variations of a novel metric-based symbol predistortion method are presented. Their algorithm consists of predistorting a set of input symbols per block using simple metrics, which measure how much each symbol contributes to the output signal samples of large magnitudes. The symbols to be predistorted in each block are selected as those with the largest positive-valued metrics. Predistortion of input symbols is performed either by scaling only the amplitude or by scaling separately the real and/or the imaginary parts of the selected symbols. The simple metric-based structure of the proposed algorithm gives high flexibility which enables various tradeoffs between performance and complexity. Another important feature is that the algorithm does not require transmitting any side information to the receiver and it does not involve any additional complexity for symbol detection at the receiver side. It is shown by simulations that a considerable improvement can be achieved with this algorithm, which can be implemented as one-shot or via iterative procedures. However, the proposed algorithm is still quite complex.

SUMMARY OF THE INVENTION

To the end of overcoming at least one of the prior art drawbacks, while preserving its advantages, it is provided, according to a first aspect of the invention, a digital pre-distortion method for OFDM-based communication system, wherein the transmitter is designed to transmit an OFDM symbol comprised of a set of $N_{FFT}$ complex symbols $\{s_k\}$, with each complex symbol $s_k$ being intended to be transmitted onto a single subcarrier k among a set of $N_{FFT}$ sub-carriers, with each complex symbol $s_k$ being modulated according to a determined Modulation Coding Scheme (MCS) among a plurality of implementable MCSs and each subcarrier k belonging to a subset of said $N_{FFT}$ sub-carriers among a plurality of predetermined subsets, said transmitter being designed to consult a set of data tables, wherein each data table is predetermined for one determined of said implementable MCSs and wherein each table comprising a plurality of weighting coefficients, with each weighting coefficient being associated to a determined subset of sub-carriers, the method comprising the following steps, after a so-called frequency mapping step for generating said set of $N_{FFT}$ complex symbols ($s_k$) of the OFDM symbol:

1) compute a Peak-to-Average Power Ratio (PAPR) of the OFDM symbol,
2) If the computed PAPR is larger than a predetermined threshold value:
   a) For at least one complex symbol $s_k$, compute a vector metric $M_k$, with said vector metric $M_k$ measuring the contribution of the subcarrier k to the computed Peak-to-Average Power Ratio, and
   b) For said at least one complex symbol $s_k$, determine a weighting coefficient $W_k$ by consulting the one of said data tables which is predetermined for the MCS according to which said at least one complex symbol $s_k$ is modulated and with said weighting coefficient $W_k$ being associated in the data table with the determined subset to which belongs the subcarrier k onto which said at least one complex symbol $s_k$ is intended to be transmitted, then
   c) For said at least one complex symbol $s_k$, compute an error signal $e_k$ in function of the computed vector metric $M_k$ and the determined weighting coefficient $W_k$, and
   d) For said at least one complex symbol $s_k$, compute a perturbed complex symbol $\bar{s}_k$ in function of said at least one complex symbol $s_k$ and the computed error signal $e_k$, then
3) Generate a perturbed set of $N_{FFT}$ complex symbols $\{\bar{s}_k\}$ by replacing, in said set of $N_{FFT}$ complex symbols $\{s_k\}$, each of said at least one complex symbol $s_k$ by the computed perturbed complex symbol $\bar{s}_k$ which corresponds thereto, then
4) Perform an $N_{FFT}$-point Inverse Fast Fourier Transform (IFFT) to the perturbed set of $N_{FFT}$ complex symbols $\{\bar{s}_k\}$, for generating a corresponding set of time-domain samples $\{\bar{t}_k\}$ to be pushed, through a power amplifier (PA) of the transmitter, towards radiofrequency (RF) transmission.

This method proposes a way to digitally predistort, at the level of the transmitter of an OFDM-based communication system, the signal to be emitted. Advantageously, it does not require to treat separately the real part and the imaginary part of said complex symbol $s_k$ and which considers, as a relevant parameter, the specific subset each subcarrier is belonging thereto. The method allows taking into account the spectral mask requirement in addition to the Error Vector Magnitude (EVM) requirement. The invention relies mainly on the use of weighting coefficients which have to be defined according to some strategies that are detailed below.

Optionally, the invention may have any of the following facultative features that can be used separately or in combination.

If the computed PAPR is less than said predetermined threshold value, skip steps a) to d) and step 3) and implement step 4) by using said set of $N_{FFT}$ complex symbols $\{s_k\}$ in place of said perturbed set of $N_{FFT}$ complex symbols $\{s_k\}$.

According to an optional embodiment of the first aspect of the invention, each data table of said set of data tables is predetermined, for at least one determined of said implementable MCSs, by:

i) Considering an Input Back Off value strictly inferior to the smallest value for which requirements in terms of Error Vector Magnitude (EVM) and/or spectral mask are fulfilled for said set of $N_{FFT}$ complex symbols $\{s_k\}$, ii) Implementing steps 1) to 4) with a heuristically defined set of test values for said plurality of weighting coefficients, iii) Computing a EVM and a spectral distribution function resulting from said Input Back Off (IBO) value and said heuristically defined set of test values for said plurality of weighting coefficients, iv) If the resulting EVM and/or the resulting spectral distribution function still fulfill the requirements in terms of EVM and spectral mask, then putting said set of test values and the considered IBO value in the data table associated with said one determined of said implementable MCSs as said plurality of weighting coefficients and an optimized IBO value respectively, v) If the resulting EVM and/or the resulting spectral distribution function do not fulfill the requirements in terms of EVM and spectral mask, change said set of test values and/or the considered IBO value and repeat steps ii) and iii) until finding a set of test values and an IBO value for which the requirements in terms of EVM and spectral mask are fulfilled so as to put iv) this set of test values and the considered IBO value in the data table associated with said one determined of said implementable MCSs as said plurality of weighting coefficients and an optimized IBO value respectively.

The transmitter may then be configured to transmit said OFDM symbol with the considered Input Back Off value. A significant reduction in energy consumption of the power amplifier may thus be achieved.

Said set of $N_{FFT}$ sub-carriers may be of frequencies different from each other. Moreover, said frequencies may belong to a predetermined frequency range.

According to another optional embodiment of the first aspect of the invention, said plurality of predetermined subsets is chosen as comprising at least one subset of subcarriers of frequencies dedicated to be used in accordance with spectral mask requirement, said frequencies being called "in-band" frequencies, and at least one subset for subcarriers of frequencies dedicated to be unused in accordance with said spectral mask requirement, said frequencies being called "out-of-band" frequencies.

According to another optional embodiment of the first aspect of the invention, and in alternative or combination with the previously introduced optional embodiment, said plurality of predetermined subsets is chosen as comprising a data subset for data symbols, a pilot subset for pilot symbols, a Direct Current (DC) subset for the subcarriers whose frequencies are centered relative to said predetermined frequency range, a side subset for first subcarriers on each side of said in-band frequencies, and an outside subset for others subcarriers among said $N_{FFT}$ subcarriers. Data, pilot and DC subsets are gathered on subcarriers of in-band frequencies. Side and outside subsets are on subcarriers of out-of-band frequencies.

The aforementioned step consisting in heuristically defining said set of test values for said plurality of weighting coefficients should be implemented by considering the following indications.

The heuristic definition of said set of test values should obey the following rules, with said MCSs resulting in different data rates:

If said at least one determined of said implementable MCSs is the one resulting in a weaker data rate, then define the set of test values with non-zero test values for the subcarriers of in-band frequencies (dedicated to be used in accordance with spectral mask requirement) and with null test values for the subcarriers of out-of-band frequencies (dedicated to be unused in accordance with said spectral mask requirement), If said at least one determined of said implementable MCSs is the one resulting in a larger data rate, then define the set of test values with null test values for the subcarriers of in-band frequencies (dedicated to be used in accordance with spectral mask requirement) and with non-zero test values for the subcarriers of out-of-band frequencies (dedicated to be unused in accordance with said spectral mask requirement), If said at least one determined of said implementable MCSs is neither the one resulting in a weaker data rate, nor the one resulting in a larger data rate, foreseen to define the set of test values with non-zero test values for all the subcarriers, Said non-zero test values is for instance comprised between −30 dB and 20 dB, preferably entre −20 dB and 0 dB, and typically around −10 dB. Note that 0 dB corresponds to a non-zero test value equal to 1.

In addition or as an alternative, the heuristic definition of said set of test values may obey at least one of the following rules:

The error signals $e_k$ for perturbing complex symbols intended to be transmitted onto subcarriers belonging to said data subset are computed as a function of the EVM requirement, The error signals $e_k$ for perturbing complex symbols intended to be transmitted onto subcarriers belonging to said side and outside subsets are computed as a function of the spectral mask requirement, The error signals $e_k$ for perturbing complex symbols intended to be transmitted onto subcarriers belonging to said pilot subset are computed in order to not change a phase of said complex symbols, and The error signals $e_k$ for perturbing complex symbols intended to be transmitted onto subcarriers belonging to said DC subset are computed in order to avoid burst power phenomena.

Preferably, aforementioned step a) is performed for each complex symbol $s_k$ and aforementioned steps b) to d) are performed for a set of complex symbols $s_k$ for each of which the computed vector metric $M_k$ is larger than a second predetermined threshold value or for a set of complex symbols $s_k$ of fixed cardinal number K for which the computed vector metrics are the bigger among all the computed vector metrics.

Aforementioned step a) can more particularly comprise:

Implement an $N_{FFT}$-point IFFT to said set of $N_{FFT}$ complex symbols $\{s_k\}$ to obtain discrete time-domain samples $\{t_n\}$ of said $N_{FFT}$ complex symbols $\{s_k\}$, For said at least one complex symbol $s_k$, compute the vector metric $M_k$ according to $$M_k = -\sum_{n \in K} t_n |t_n|^p e^{-2j\pi nk/N_{FFT}},$$

where K is a subset of $N_{FFT}$ elements in $\{t_n\}$, with by default $K=\{1 \ldots N_{FFT}\}$, and where $p>1$ is a user defined parameter, usually $p=3$ or 4.

Aforementioned step c) can consist in multiplying the computed vector metric $M_k$ by the determined weighting coefficient $W_k$.

Aforementioned step d) can consist in adding the computed error signal $e_k$ to said at least one complex symbol $s_k$.

In a preferential framework of application of the hereabove introduced method, the OFDM-based communication system is a WiFi communication system.

Each of said $N_{FFT}$ complex symbols $\{s_k\}$ is modulated by using one among Phase-Shift Keying (PSK) modulation and Quadrature Amplitude Modulation (QAM). For instance, four MCSs are considered among which Binary Phase-Shift Keying (BPSK), Quadrature Phase-Shift Keying (QPSK), 16-QAM and 64-QAM.

According to a second aspect of the invention, it is provided a computer program product comprising instructions which, when implemented by at least one digital processing device, performs at least the steps 1) to 4) of the method introduced above. In addition or as an alternative, it is provided a non-transitory computer readable medium storing instructions which, when implemented by at least one digital processing device, performs at least the steps 1) to 4) of the method introduced above.

According to a third aspect of the invention, it is provided a transmitter of an OFDM-based communication system, wherein said transmitter is configured to implement at least the steps 1) to 4) of the method introduced above.

According to a fourth aspect of the present invention, it is provided an OFDM-based communication system which comprises at least one transmitter according to the third aspect of the invention. Said OFDM-based communication system can further comprise a receiver, this latter remaining potentially unchanged with respect to existing ones.

Further objects, features and advantages of the present invention will become apparent to the ones skilled in the art upon examination of the following description in reference to the accompanying drawings. It is intended that any additional advantages may be incorporated herein.

BRIEF DESCRIPTION OF THE DRAWINGS

FIGS. 11A and 11B illustrate graphically the power spectral density (PSD) of a signal transmitted by implementing the method according to the second variant illustrated on FIG. 10, FIG. 11B being a focus on a part of interest of FIG. 11A.

The figures are given as examples and are not restrictive to the invention. They are principle schematic representations intended to facilitate the understanding of the invention.

DETAILED DESCRIPTION

Herein "data table" is a term used to denote a mode of organization of data according to which data is organized in a table stored on a memory support and consisting of columns and rows, where each cell contains information and links between the data.

The following detailed description of the invention refers to the accompanying drawings. While the description includes exemplary embodiments, other embodiments are possible, and changes may be made to the embodiments described without departing from the scope of the invention.

OFDM refers to a multi-carrier transmission technique according to which data to be transmitted from a transmitter to at least one receiver is coded into an OFDM symbol, or a sequence of OFDM symbols, comprised of a set of several complex symbols $\{s_k\}$. More particularly, said set of complex symbols $\{s_k\}$ is transmitted in parallel onto a set of subcarriers $\{k\}$ of different frequencies. Since the subcarriers are mutually orthogonal, they do not interfere with one another.

In a well-known manner, the Inverse Fast Fourier Transform (IFFT) 170 (See FIG. 3) provides a simple way to modulate $N_{FFT}$ symbols onto $N_{FFT}$ subcarriers. Indeed, the output of the IFFT 170 may be viewed as the sum of $N_{FFT}$ orthogonal sinusoids, each of said sinusoids extending around a different average frequency.

Figure 3:
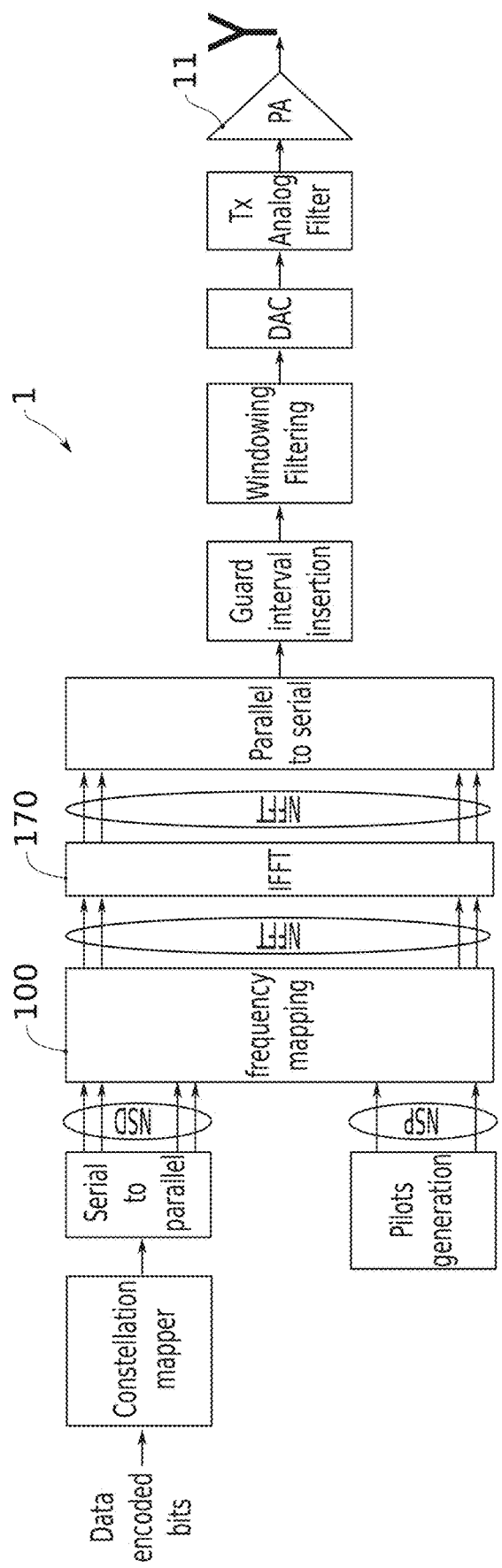
FIG. 3 illustrates schematically a WiFi transmitter as a diagram of functional blocks according to the prior art.

Thus, with reference to FIG. 3, in an OFDM transmitter 1, the IFFT 170 takes a set of $N_{FFT}$ complex symbols $\{s_k\}$ treated as though they are in the frequency-domain and transforms them into a time-domain signal.

In practice, only some of the $N_{FFT}$ subcarriers carry said data to be transmitted. For instance, with reference to FIG. 2 that shows an example of frequency mapping of $N_{FFT}$ subcarriers, the data symbols among said $N_{FFT}$ complex symbols NJ are carried by subcarriers represented by long dashes. These subcarriers can be viewed as belonging to a subset of subcarriers allocated to data to be transmitted, and is called 'data subset'. Some other subcarriers are allocated to pilot symbols, represented by short dashes, and can be gathered in a subset called 'pilot subset'. Pilot symbols are typically used for other purposes than carrying said data to be transmitted. Said other purposes comprise for instance synchronization between said transmitter 1 and said at least one receiver. At least one DC subcarrier is also foreseen. Some other subcarriers, such as side and outside subcarriers, are also foresaw; they are typically set to 0 as they correspond to frequencies that must not be used. According to the instance depicted in FIG. 2, one single DC subcarrier is represented by a circle, six side subcarriers are represented by squares, and outside subcarriers are represented by triangles. On FIG. 2, the dark line represents a spectral mask defining the maximum admissible power per average frequency of subcarriers. The spectral mask is defined by the standard and has to be respected. We observe that the spectral mask shows three main regions. A central region 31 of the frequency range 30 into which frequencies of subcarriers are dedicated to be used, these frequencies being called "in-band" frequencies, and side and outside regions 32 into which frequencies of subcarriers are generally unused, these frequencies being called "out-of-band" frequencies.

Figure 2:
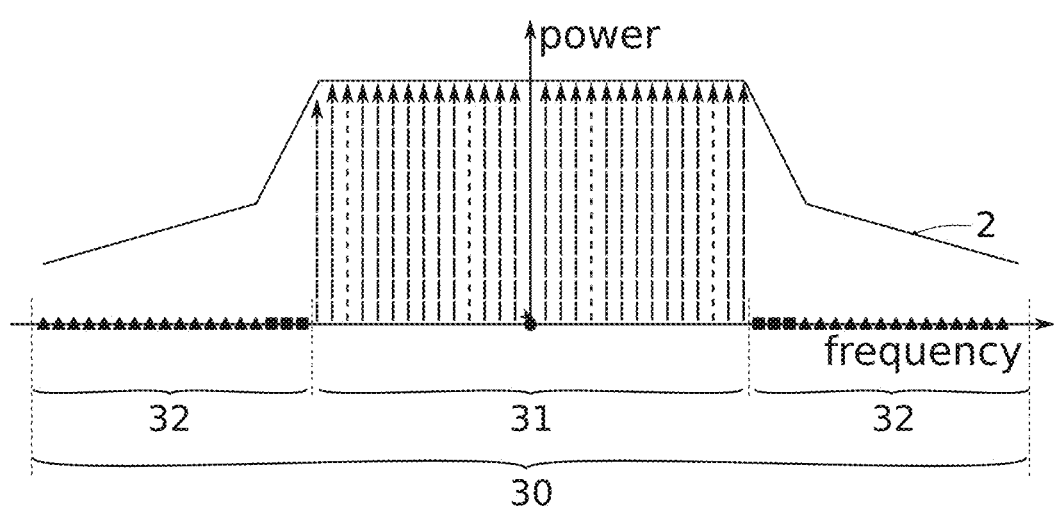
FIG. 2 illustrates graphically a distribution of $N_{FFT}$ subcarriers of different kinds on a standard frequency range and the spectral mask to respect.

FIG. 3 gives a coarse representation of a WiFi physical layer (PHY) transmit path. In a well-known manner, the illustrated constellation mapper block is designed to convert a sequence of encoded data bits, corresponding to said data to be transmitted, into coded symbols according to a given Modulation Coding Scheme (MCS), for instance into QAM symbols. The set of data symbols thus obtained is nothing else but the part of the OFDM symbol representing the data to be transmitted. In parallel, a pilots generation block is provided which generates a set of pilot symbols according to the same or another given Modulation Coding Scheme (MCS), for instance into PSK modulated symbols. Said set of data symbols and said set of pilot symbols form a set of modulated symbols ready to be pushed to a frequency mapping block. In a well-known manner, the frequency mapping block maps said modulated symbols to NSD data subcarriers allocated to said data subset and NSP pilot subcarriers allocated to said pilot subset. The remaining subcarriers comprising the DC subcarrier and the side and outside subcarriers in the example shown on FIG. 2 are typically set to 0.

Figure 1:
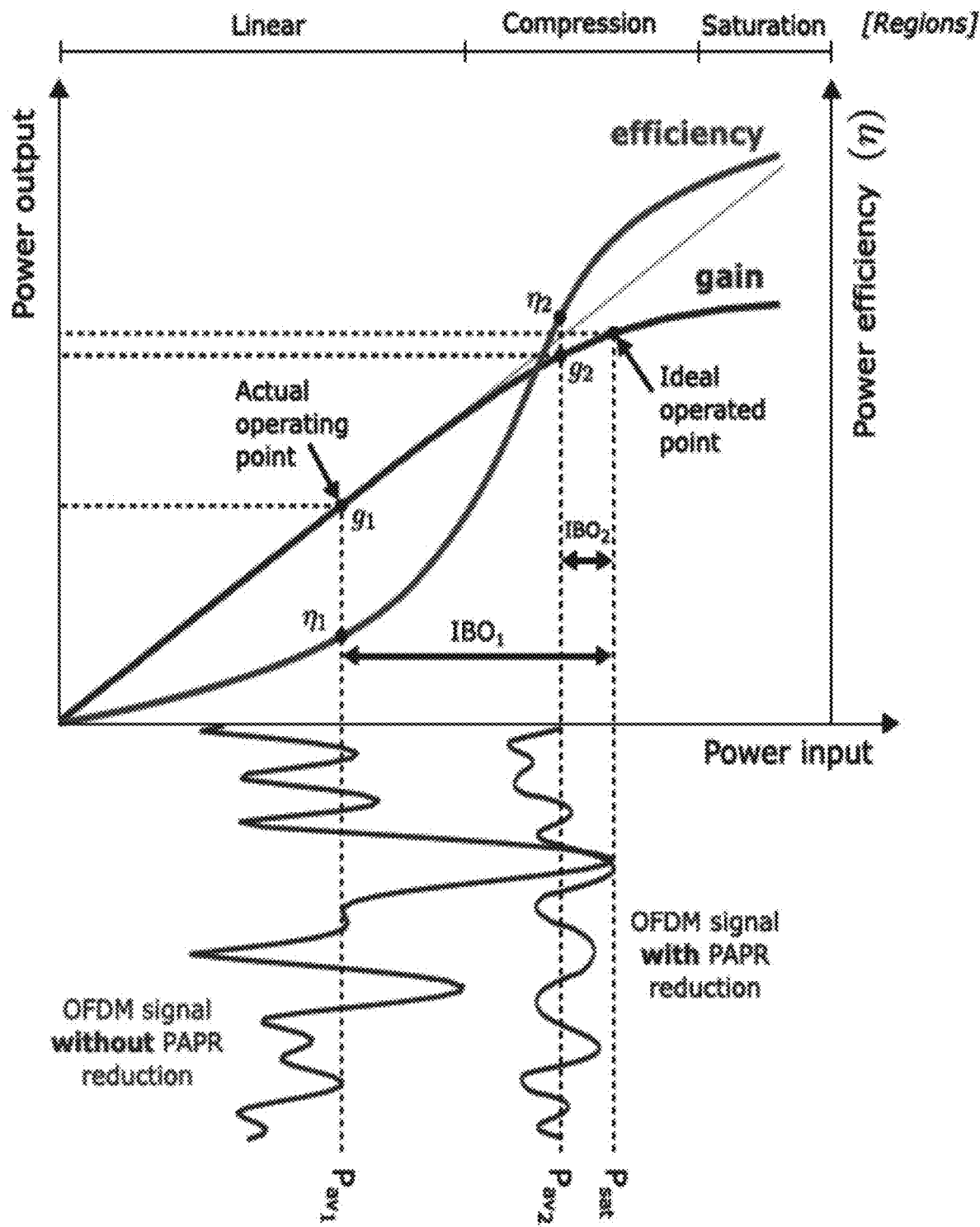
FIG. 1 illustrates graphically the efficiency of the power amplifier and the nonlinear response of a power amplifier.

Then, always in a well-known manner, the IFFT 170 generates the aforementioned time-domain signal. The OFDM symbol is then converted back to a serial time waveform by using a so-called Parallel-to-Serial (P/S) block. A guard interval is foreseen between OFDM symbols, in order to make the transmission robust against Intersymbol Interference (ISI). Then a well-known windowing and/or filtering operation is performed to fill the spectral mask. Finally, the signal goes through an analog/RF transmit path including in particular a power amplifier (PA), this latter showing a nonlinear response, as depicted above with reference to FIG. 1.

The signal transmitted, through the PA, at the antenna of the transmitter 1 shall fulfill the WiFi standard requirements in terms of Error Vector Magnitude (EVM) and spectral mask. But, the non-linearity of PA has at least one of two main effects:

Spectral regrowth, which introduces out-of-band emission that may violate the spectral mask, and In-band distortion, which degrades the transmit signal EVM performance.

Figure 4:
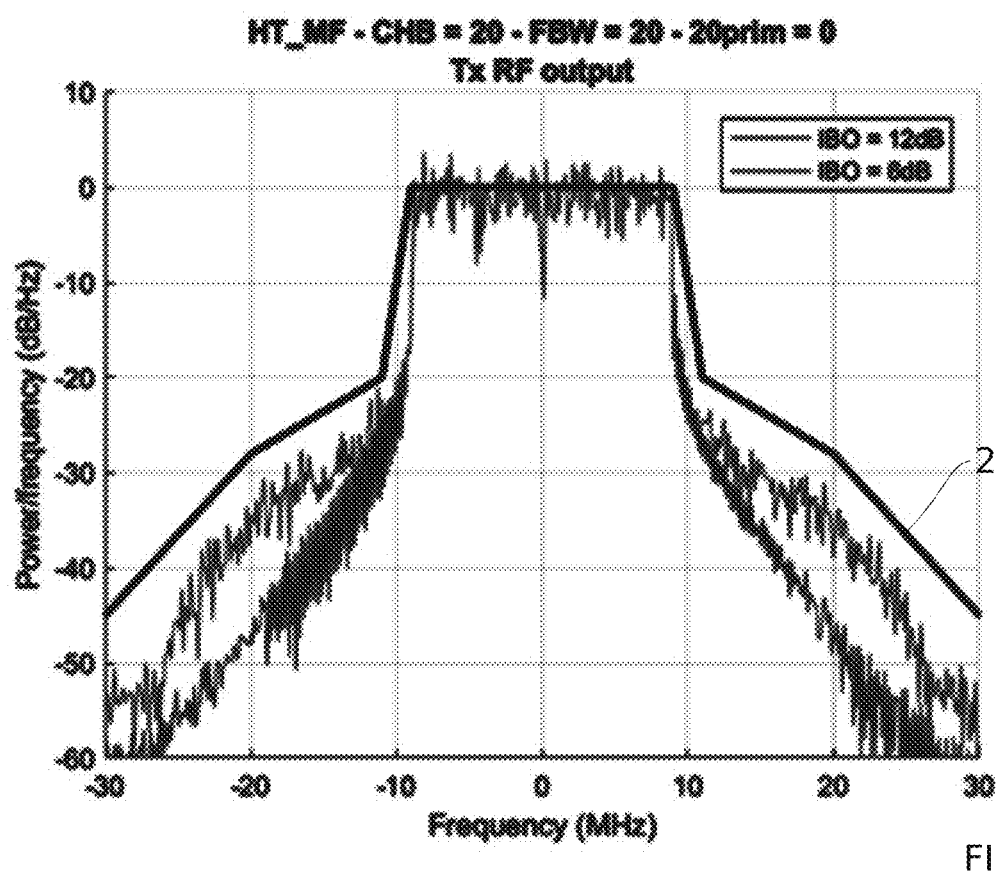
FIG. 4 illustrates graphically, for two values of IBO, the power spectral density (PSD) of a signal transmitted without implementing the method according to the first aspect of the present invention.
Figure 5A:
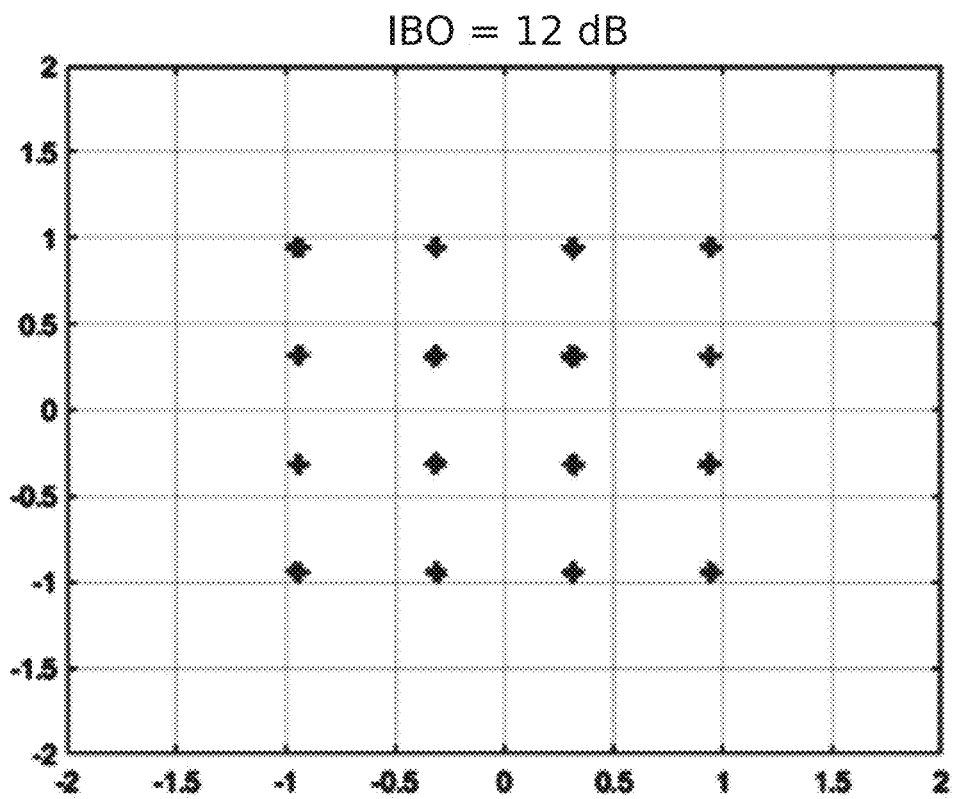
FIGS. 5A and 5B illustrate graphically, each for one of two values of IBO, the constellation diagram of a signal transmitted without implementing the method according to the first aspect of the present invention.
Figure 5B:
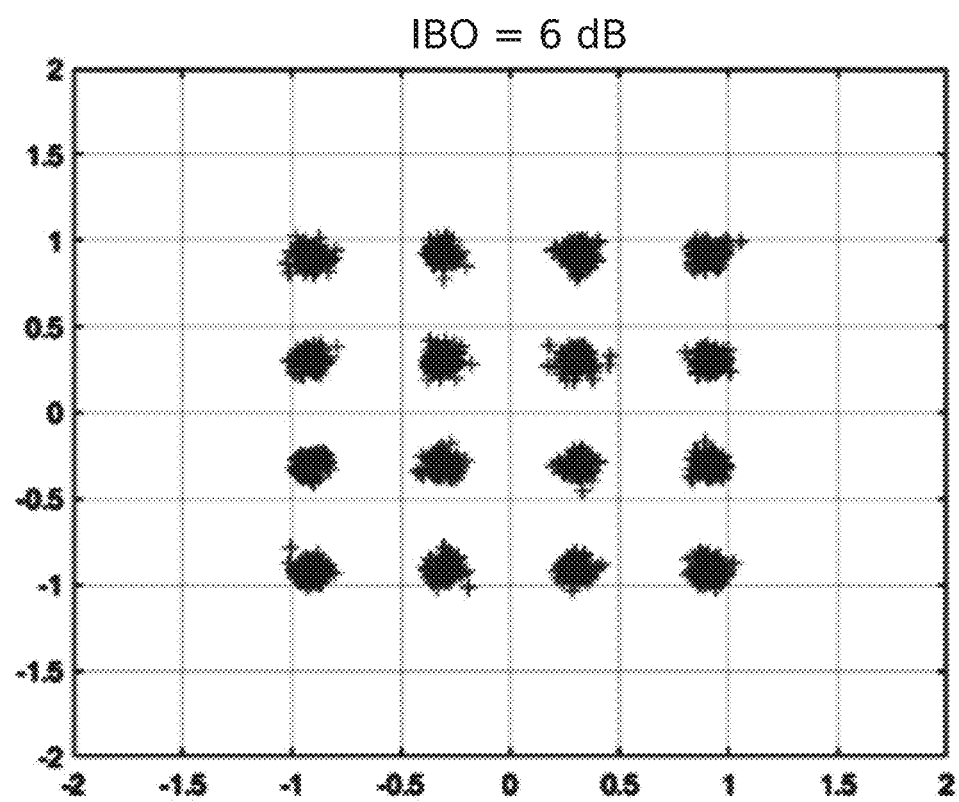

FIGS. 4 and 5 illustrate each of these two effects respectively. More particularly, FIGS. 4 and 5 illustrate results obtained by a digital simulation of a data transmission according to the transmit path detailed above. The simulation has been made for the 20 MHz 802.11n HT transmission with the so-called Rapp model of PA (with a knee factor p equal to 2). More particularly, FIG. 4 shows the Power Spectral Density (PSD) at the transmitter antenna for two different values of the Input Back Off (IBO) of the PA. The dark line represents the WiFi spectral requirement. The irregular curve closest to the spectral mask has been obtained for an IBO equal to 6 dB and the irregular curve farthest from the spectral mask has been obtained for an IBO equal to 12 dB. One can clearly see the spectral regrowth. FIG. 5 shows the received constellation. This illustration may be used to compute or at least represent the transmitter EVM. One can see the effect of the PA non-linearity on the transmitter performance.

The aim pursued by the method according to the present invention is to reduce the IBO value, preferably as much as possible, in order to enhance, or even optimize, the PA efficiency or in order to reduce its energy consumption by maintaining, or even enhancing, its efficiency. Nontheless, the IBO reduction is limited by the WiFi standard requirements in terms of EVM and spectral mask. The EVM requirement depends on the data rate, with this latter being characterized by the MCS (Modulation Coding Scheme) parameter. Table 1 gives the EVM requirement per MCS for the 802.11n (HT) transmission.

TABLE 1

Allowed EVM versus constellation size and coding rate

| MCS | Modulation | Coding rate | Relative constellation error (EVM) [dB] |
| --- | --- | --- | --- |
| 0 | BPSK | 1/2 | −5 |
| 1 | QPSK | 1/2 | −10 |
| 2 | QPSK | 3/4 | −13 |
| 3 | 16-QAM | 1/2 | −16 |
| 4 | 16-QAM | 3/4 | −19 |
| 5 | 64-QAM | 2/3 | −22 |
| 6 | 64-QAM | 3/4 | −25 |
| 7 | 64-QAM | 5/6 | −27 |

In light of the foregoing, let's describe below how the method according to an embodiment of the present invention provides a solution to achieve its object(s).

Let's denote by $IBO_{ref}$ a reference value, which corresponds to the smallest IBO value for which the transmitted signal still meets the WiFi requirements in terms of EVM and spectral mask without implementing the method of the present invention. Clearly, this reference value $IBO_{ref}$ depends on the MCS.

The present invention provides a method designed to slightly distort or modify the IFFT 170 inputs. The guiding idea is that the minimal IBO value for which the slightly modified, or corrupted, inputs still fulfill the WiFi standard requirements is inferior to the reference value $IBO_{ref}$.

This means in particular that the "corruption" introduced by the method according to the present invention plus the distortion due to the PA non-linearity (applied to the corrupted signal) must result in a distortion less than the distortion introduced by the PA on the initial signal having a non-distorted signal.

According to the present invention, each subcarrier k is corrupted by an error signal $e_k$ whose characteristics depend on the considered subcarrier k and the MCS according to which the complex symbol $s_k$ generated by the aforementioned frequency mapping block has been modulated.

By calling $\bar{s}_k$ the complex symbol 'corrupted' according the present invention, let $\bar{s}_k$ verify:

$$\bar{s}_k = s_k + e_k$$

Typically, one can considered five categories or subsets of subcarriers as depicted above with reference to FIG. 2. The following items give, for each identified subset of subcarriers, indication(s) for computing a suitable error signal $e_k$, and more particularly for defining suitable weighting coefficients in function of which said suitable error signal $e_k$ is to be computed:

For said data subset, the power of the error signal $e_k$ to be added to at least one complex symbol $s_k$ should be computed as a function of the EVM requirement;

For side subset and/or outside subset, the power of the error signal $e_k$ to be added to at least one complex symbol $s_k$ should be computed as a function of the spectral mask requirement;

For pilot subset, knowing that, in WiFi communication systems, the pilots are Binary(B)PSK encoded and most of the receivers use only the phase of the pilot symbol (and not its amplitude) to track the frequency and clock offset, the error signal $e_k$ must not impact the phase. More particularly, $e_k$ is real and sign($s_k+e_k$)=sign ($s_k$). Except this requirement, there is no strong constraint on the amplitude of the error signal $e_k$. For the sake of simplicity and as a precaution, one can choose not to affect any of the subcarriers belonging to said pilot subset because the quality of estimation of their phase may be considered as critical in many applications;

For said DC subset, the DC subcarriers are not carrying any information. The error signal $e_k$ to be added to at least one complex symbol $s_k$ intended to be transmitted on a subcarrier of this subset can have a quite significant power. Nonetheless, we should pay attention here to 'burst power' phenomena that can be deemed to be a critical aspect, since such phenomena could be unfavorable for transmission quality of OFDM symbols with large fluctuations of their power envelope.

Furthermore, we can already note that the weighting coefficients, expressed in decibel (dB), can be limited to a set of integers, or a set of decimal numerals, for instance limited in turn to the ones with a single decimal, comprised between −20 and 20.

Figure 6:
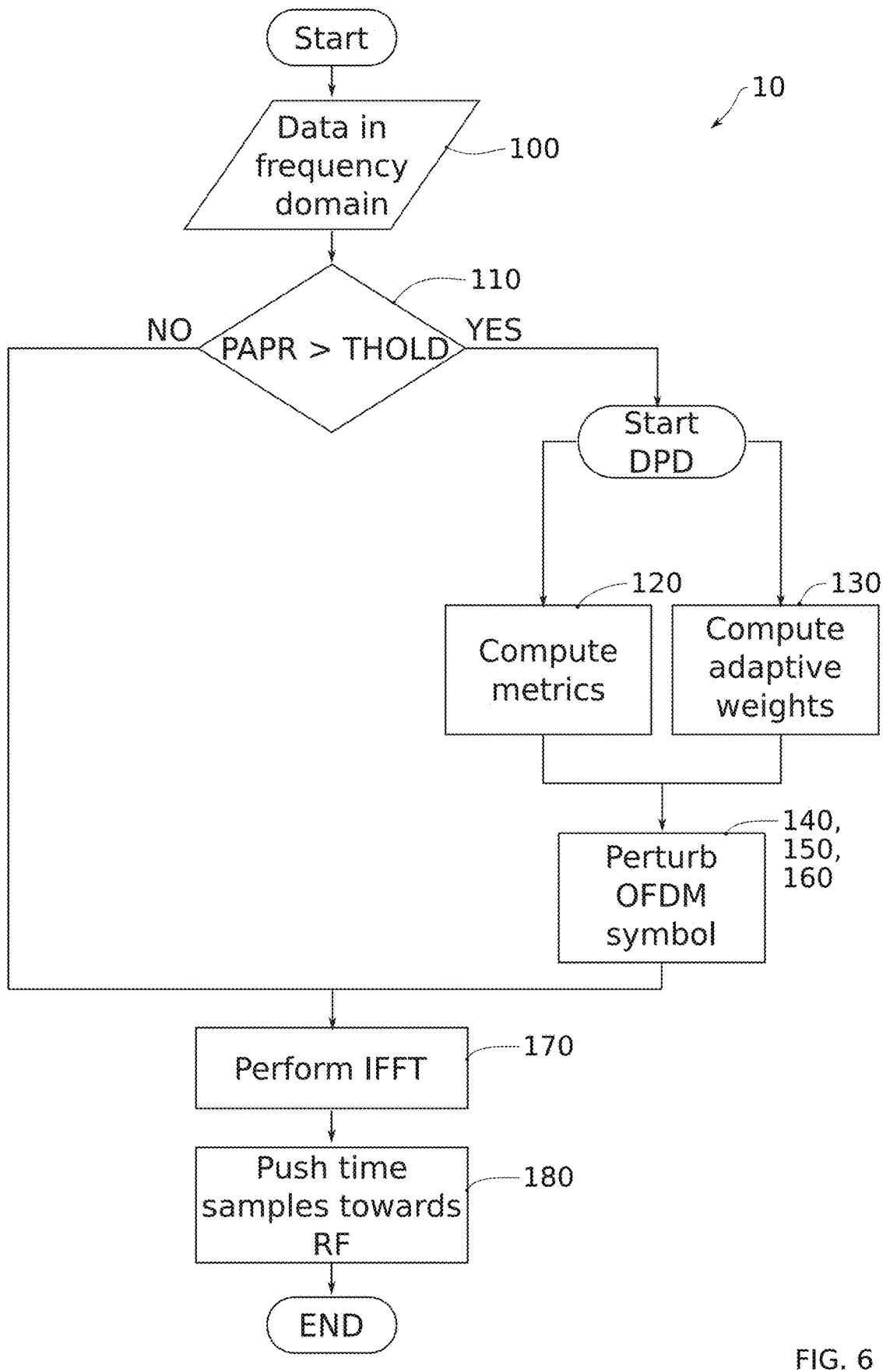
FIG. 6 is a flowchart of the method according to an embodiment of the first aspect of the invention.

A flowchart of the proposed method 10 is given in FIG. 6. As one case see, we can distinguish the following phases of operation, after the above introduced frequency mapping step 100 for generating said set of $N_{FFT}$ complex symbols $\{s_k\}$ of the OFDM symbol:

1) Compute 110 a Peak-to-Average Power Ratio (PAPR) of the OFDM symbol,
2) If the computed PAPR is larger than a predefined threshold value, trigger a digital pre-distortion (DPD) process comprising the following substeps:

a) For at least one complex symbol $s_k$, compute 120 a vector metric $M_k$, with said vector metric $M_k$ measuring the contribution of the subcarrier k to the computed PAPR, and
b) For said at least one complex symbol $s_k$, determine 130 a weighting coefficient $W_k$ by consulting one of predetermined data tables among a set of data tables, wherein each data table is predetermined for one determined of said implementable MCSs and wherein each table comprising a plurality of weighting coefficients, with each weighting coefficient being associated to a determined subset of subcarriers, with the data table to be consulted being the one predetermined for the MCS according to which said at least one complex symbol $s_k$ is modulated and with said weighting coefficient $W_k$ being associated in the data table with the determined subset to which belongs the subcarrier k onto which said at least one complex symbol $s_k$ is intended to be transmitted, then
c) For said at least one complex symbol $s_k$, compute 140 an error signal $e_k$ in function of the computed vector metric $M_k$ and the determined weighting coefficient $W_k$, and
d) For said at least one complex symbol $s_k$, compute 150 a perturbed complex symbol $\bar{s}_k$ in function of said at least one complex symbol $s_k$ and the computed error signal $e_k$, by verifying for instance the above given equation $\bar{s}_k = s_k + e_k$.

The aforementioned substeps aim at weighting in an adaptive manner each metric element to give better performance, for instance in terms of EVM or power efficiency of PA, and at the same time comply with the spectral mask requirement.

At this stage, we are now ready to perturb said OFDM symbol. To this end, the method 10 foresees the following steps:

3) Generate 160 a perturbed set of $N_{FFT}$ complex symbols $\{\bar{s}_k\}$ by replacing, in said set of $N_{FFT}$ complex symbols $\{s_k\}$, each of said at least one complex symbol $s_k$ by the computed 150 perturbed complex symbol $\bar{s}_k$ which corresponds thereto, then
4) Perform 170 an $N_{FFT}$-point IFFT to the perturbed set of $N_{FFT}$ complex symbols $\{\bar{s}_k\}$, for generating a corresponding set of time-domain samples $\{\bar{t}_k\}$ to be pushed 180, through PA 11 of the transmitter 1, towards RF transmission.

We thus perform 170 an IFFT to prepare the samples for next stages (notably P/S, DAC, RF) of the above detailed WiFi physical layer (PHY) transmit path. Said next stages can advantageously be implemented as ordinary.

The method 10 can thus be viewed as consisting in inserting a DPD block into the standard WiFi physical layer (PHY) transmit path, between the frequency mapping block and the IFFT block. Said DPD block can be purely digital, purely analogical or a mix thereof. It is preferred for it to be purely digital.

If the computed 110 PAPR of the OFDM symbol is less than said predefined threshold value, the DPD process is skipped, hence no distortion is applied. More particularly, steps a) to d) and step 3) are skipped and step 4) is implemented by using said set of $N_{FFT}$ complex symbols $\{s_k\}$ in place of said perturbed set of $N_{FFT}$ complex symbols $\{\bar{s}_k\}$.

Figure 7:
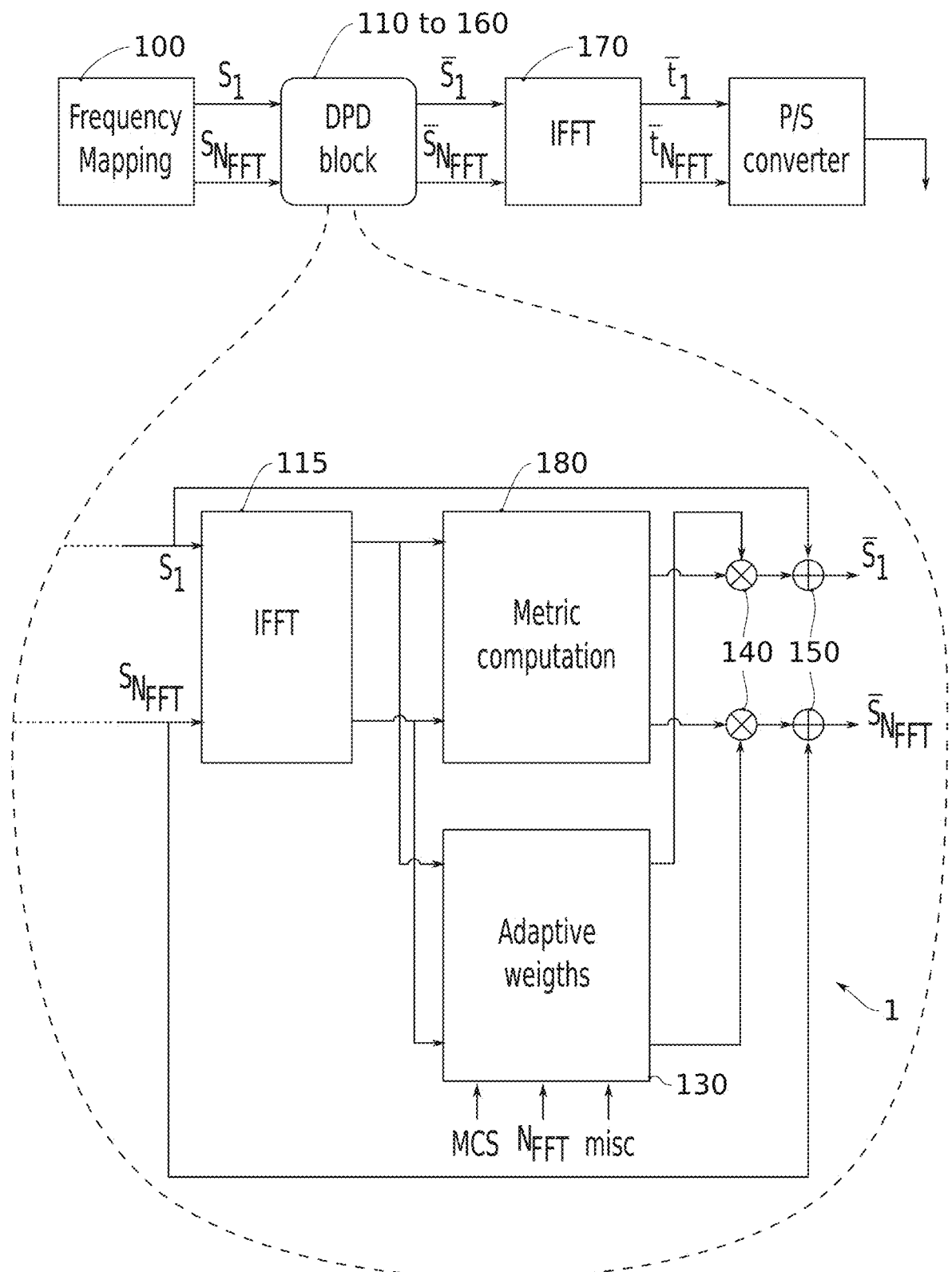
FIG. 7 illustrates schematically a WiFi transmitter according to the third aspect of the invention as a diagram of functional blocks.

FIG. 7 illustrate a functional block diagram of a part of the WiFi physical layer (PHY) transmit path including said DPD block. The complex symbols that are of the form $\bar{s}_k$ are obtained by perturbing at least one, potentially all, of the original complex symbols $s_k$. It is preferred to perturb the original complex symbols $s_k$ where the latter would severely contribute to PAPR (hence to a degradation in EVM performance), if no DPD process is done. Hence, steps b) to d) may be performed only for a set of complex symbols $s_k$ for each of which the computed 120 vector metric $M_k$ is larger than a second predetermined threshold value. As an alternative, steps b) to d) may be performed only for a set of complex symbols $s_k$ of fixed cardinal number K for which the computed 120 vector metrics are the bigger among all the computed 120 vector metrics.

The substeps 120 to 150 outlined in the above described flowchart are reflected in the DPD block in FIG. 7.

We can further see on FIG. 7 that both substeps 120 and 130, discussed above, are implemented in "Metric Computation" and "Adaptive Weights" blocks.

FIG. 7 also illustrates that step a) can more particularly comprise the following, before computing 120 the vector metric $M_k$, a substep consisting in implementing 115 an $N_{FFT}$-point IFFT to said set of $N_{FFT}$ complex symbols $\{s_k\}$ to obtain discrete time-domain samples $\{t_n\}$ of said $N_{FFT}$ complex symbols $\{s_k\}$. hence, for said at least one complex symbol $s_k$, the computation 120 of the vector metric $M_k$ can be performed according to the following equation:

$$M_k = -\sum_{n \in K} t_n |t_n|^p e^{-2j\pi nk/N_{FFT}},$$

with by default $K = \{1 \ldots N_{FFT}\}$, and where $p > 1$ is a user defined parameter, usually $p = 3$ or 4. This user defined parameter p can be viewed as a discrimination criterion between contributions of subcarrier $\{k\}$ to the computed PAPR. Note here that $t_n$ denotes the $n^{th}$ time domain sample of an 'oversampled' OFDM symbol.

FIG. 7 further illustrates that step c) consists in multiplying the computed 120 vector metric $M_k$ by the determined 130 weighting coefficient $W_k$.

As loop back to above considerations on the reference value $IBO_{ref}$ and the way to define suitable weighting coefficients for each implemented MCS and each subset of subcarriers, or even each subcarrier, let consider the following.

Each data table of said set of data tables can be predetermined, for at least one determined of said implementable MCSs, by:

i) Considering an Input Back Off (IBO) value strictly inferior to the reference value $IBO_{ref}$,
ii) Implementing steps 1) to 4) with an heuristically defined set of test values for said plurality of weighting coefficients,
iii) Computing a resulting EVM and a resulting spectral distribution function,
iv) If the resulting EVM and/or the resulting spectral distribution function still fulfill the requirements in terms of EVM and spectral mask, then putting said set of test values in the data table associated with said one determined of said implementable MCSs as said plurality of weighting coefficients.

If the resulting EVM and/or the resulting spectral distribution function do not fulfill the requirements in terms of EVM and spectral mask, change said set of test values and repeat steps ii) and iii) until finding a set of test values for which the requirements in terms of EVM and spectral mask are fulfilled so as to put iv) this set of test values in the data table associated with said one determined of said implementable MCSs as said plurality of weighting coefficients.

Actually, abovementioned steps i) and ii) are not necessarily implemented in one specific order. More particularly, since it is very complicated to foreseen the gain in IBO that can be achieved, a preferred way to proceed consists in heuristically defining said set of test values for said plurality of weighting coefficients, then in reducing the IBO value from the reference value $IBO_{ref}$, until the resulting EVM and/or the resulting spectral distribution function do not fulfill anymore the requirements in terms of EVM and spectral mask; the Input Back Off (IBO) value to be considered, for said set of test values, being the last one which result in fulfilling the requirements in terms of EVM and spectral mask.

The transmitter can thus be advantageously configured to transmit said OFDM symbol modulated according to one determined of said implementable MCSs with the considered Input Back Off value.

Such a heuristic definition of said weighting coefficients and thus of said predetermined set of data tables may look like cumbersome. Nonetheless, since the resulting EVM and/or the resulting spectral distribution function can be computed in a theoretical manner, by computer means implemented according to a search algorithm provided to this end, the effort to be done may actually be limited to write and perform such an algorithm. Note that such an algorithm can be partially based on the aforementioned Rapp model of PA. Moreover, the possibilities of sets of test values to be considered can be limited by the aforementioned indications on strategies for defining suitable weighting coefficients in function of the considered MCS, the considered subset of subcarriers, and potentially the here above limitations on the value range(s) to be tested for weighting coefficients. Note also that the method 10 does not necessarily aim at finding the optimal weighting coefficients, but some ones which allow reducing the IBO value in order to enhance the PA efficiency or in order to reduce its energy consumption by maintaining, or even enhancing, its efficiency.

It could be also noted that a gain of 1 dB on the reference value $IBO_{ref}$ may be deemed to correspond roughly to a gain of 15% in energy consumption of the PA. Thus, it is surely inadequate to look for defining data tables by considering an Input Back Off value inferior to the reference value $IBO_{ref}$ from more than 2 dB.

Examples of weight setting strategies and resulting data tables are given below for two different MCS as already discussed above in relation to Table 1. More particularly, the first example given below is relative to BPSK as MCS, with a data rate equal to ½, and the first example given below is relative to 64-QAM as MCS, with a data rate equal to ⅚.

1$^{st}$ Example: MCS 0 Case

Figure 8A:
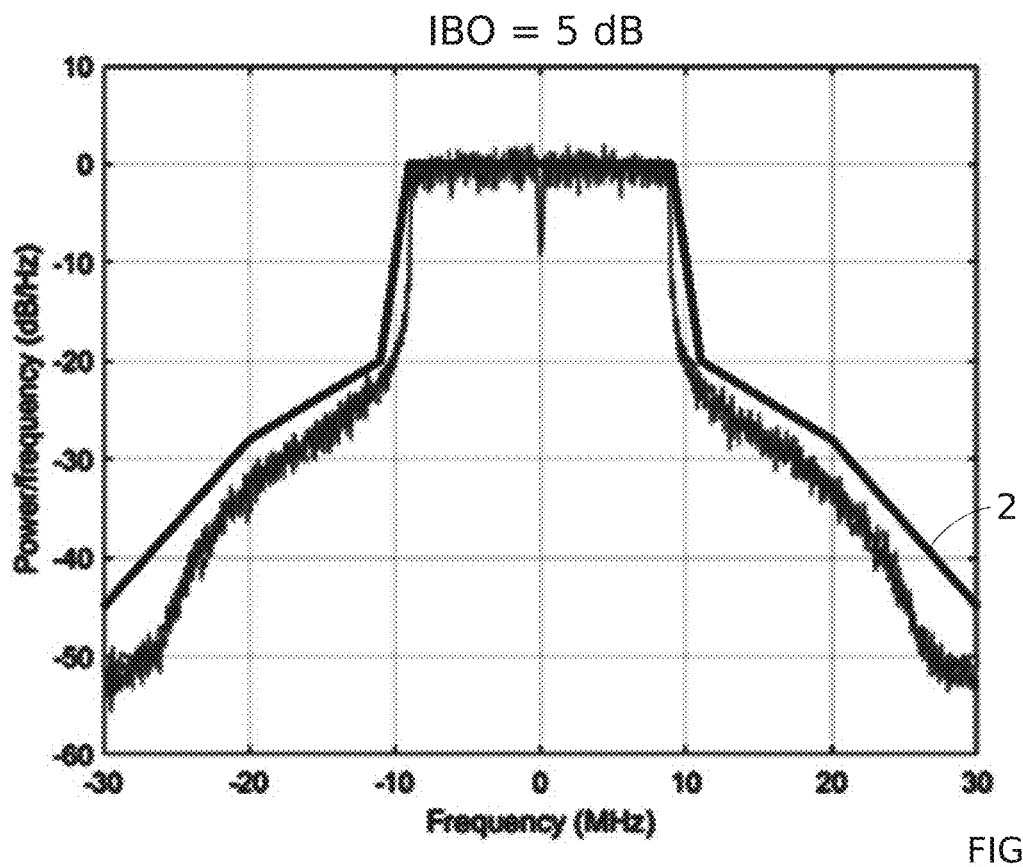
FIGS. 8A, 8B and 8C illustrate graphically, each for one of three values of IBO, the power spectral density (PSD) of a signal transmitted without implementing the method according to the first aspect of the present invention.
Figure 8B:
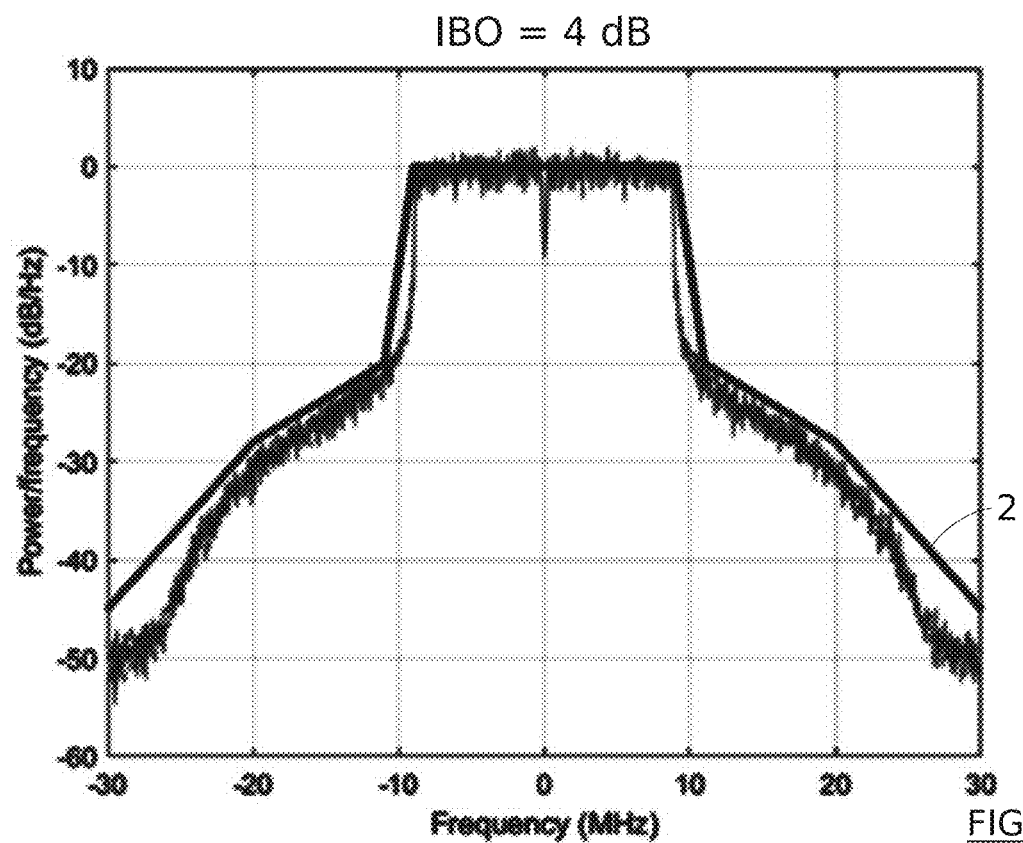
Figure 8C:
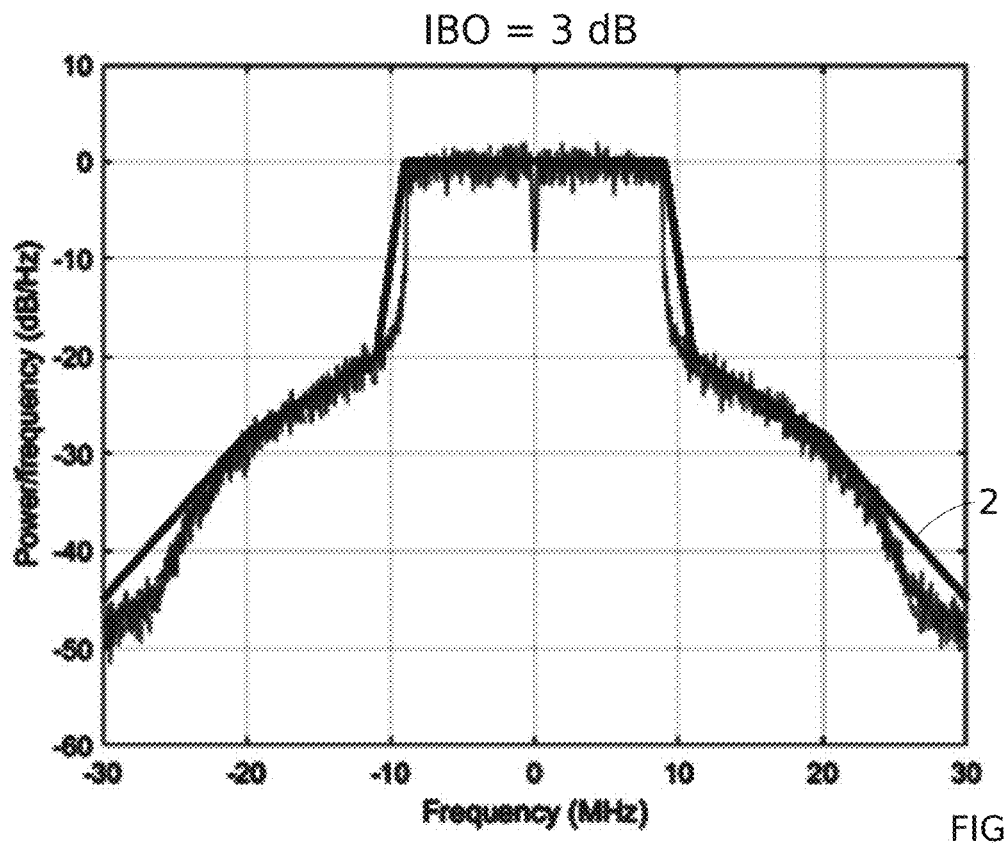

In this low MCS case, an exemplary data table is given below by table 2. This table summarizes the simulation results of an embodiment of the aforementioned search algorithm. For such a low MCS case, the critical factor is the spectral mask. Indeed, FIGS. 8A to 8C show the PSD of the transmitted signal for an IBO respectively equal to 5, 4 and 3 dB. One can see that with 3 dB IBO the spectral mask requirement is not fulfill anymore; the reference value $IBO_{ref}$ can be considered to be equal to 4 dB. On the other hand, the EVM stay quite good above −18 dB whereas the EVM requirement demands a maximum of −5 dB.

TABLE 2

Transmit performance vs IBO

| IBO | PAPR compensation | EVM [dB] | Spectral mask compliance |
|---|---|---|---|
| 5 | OFF | −22 < −5 | Yes |
| 4 | OFF | −20 < −5 | No margin |
| 3 | OFF | −18 < −5 | No |
| 3 | ON W(k) given by Table 3 | −8 < −5 | Yes |

Thus, in this case, the strategy can consist in using the margin on the EVM, for instance in order to reduce the PAPR. This means that some non-zero error signal $e_k$ should be added on the data subcarriers.

Figure 9:
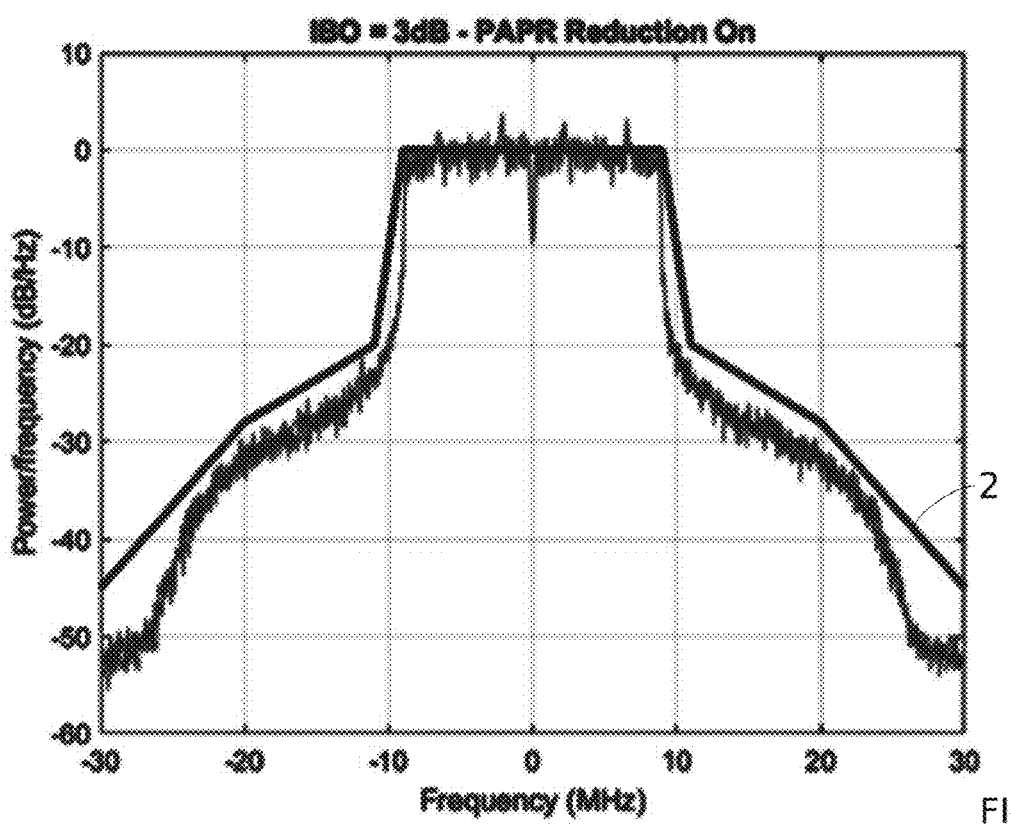
FIG. 9 illustrates graphically, for the smaller IBO value among the three values of IBO considered on FIGS. 8A, 8B and 8C, the power spectral density (PSD) of a signal transmitted by implementing the method according to the first aspect of the present invention.

FIG. 9 shows the PSD obtained with an algorithm according to an embodiment of the method according to the present invention enable, with the setting of weighting coefficients summarizes in table 3. In this case, as mentioned in table 2, the EVM is degraded to −8 dB but the spectral mask is respected even with an IBO of only 3 dB.

TABLE 3

Weight power vs subcarriers categories for MCS 0 optimization

| Data subcarrier | Side subcarriers | Out-side subcarriers | Pilot subcarriers | DC subcarrier |
|---|---|---|---|---|
| −8 dB | Null | Null | Null | Null |

Thus a gain of 1 dB with respect to the reference value $IBO_{ref}$ is achieved.

$2^{nd}$ Example: MCS 7 Case

In this high MCS case, the critical factor is the EVM which must be below −27 dB (See table 1). Table 4 summarizes the results of the PA performance. Without predistortion, it would require a minimal IBO of 7.2 dB to reach the −27 dB EVM requirement; the reference value $IBO_{ref}$ can thus be set to this value.

In this case, the strategy can consist in using the spectral mask margin.

We propose two different setting modes of the weighting coefficients. They are described in table 5: the first one only adds power on the side and outside subcarriers and the second one also allows adding error to the DC and pilot subcarriers. The IBO can be reduced from 7, 2 to 6.4 dB and up to 6 dB using respectively the first and second setting modes.

FIGS. 11A and 11B show the PSD obtained with the second setting mode of the weighting coefficients. One can clearly see that the additional power on the side subcarriers follows the spectral mask.

TABLE 4

Transmit performance vs IBO

| IBO | PAPR compensation | EVM [dB] | Spectral mask compliance |
|---|---|---|---|
| 7 | OFF | −26.3 > −27 | Yes |
| 7.2 | OFF | −27 | Yes |
| 8 | OFF | −29 | Yes |
| 7 | ON W(k) given by Table 5 Weight Mode 1 | −28.8 | Yes but with less margin |
| 7 | ON W(k) given by Table 5 Weight Mode 2 | −30 | Yes but with less margin |
| 6.4 | ON W(k) given by Table 5 Weight Mode 1 | −27 | Yes but with less margin |
| 6 | ON W(k) given by Table 5 Weight Mode 2 | −27 | Yes but with less margin |

TABLE 5

Weight power vs subcarriers categories for MCS 7 optimization

| | Data subcarrier | Side subcarriers | Out-side subcarriers | Pilot subcarriers | DC subcarrier |
|---|---|---|---|---|---|
| Weight Mode 1 | Null | From 0 to −17 dB | −20 dB | Null | Null |
| Weight Mode 2 | Null | From 0 to −17 dB | −20 dB | −10 dB | 0 dB |

Figure 10:
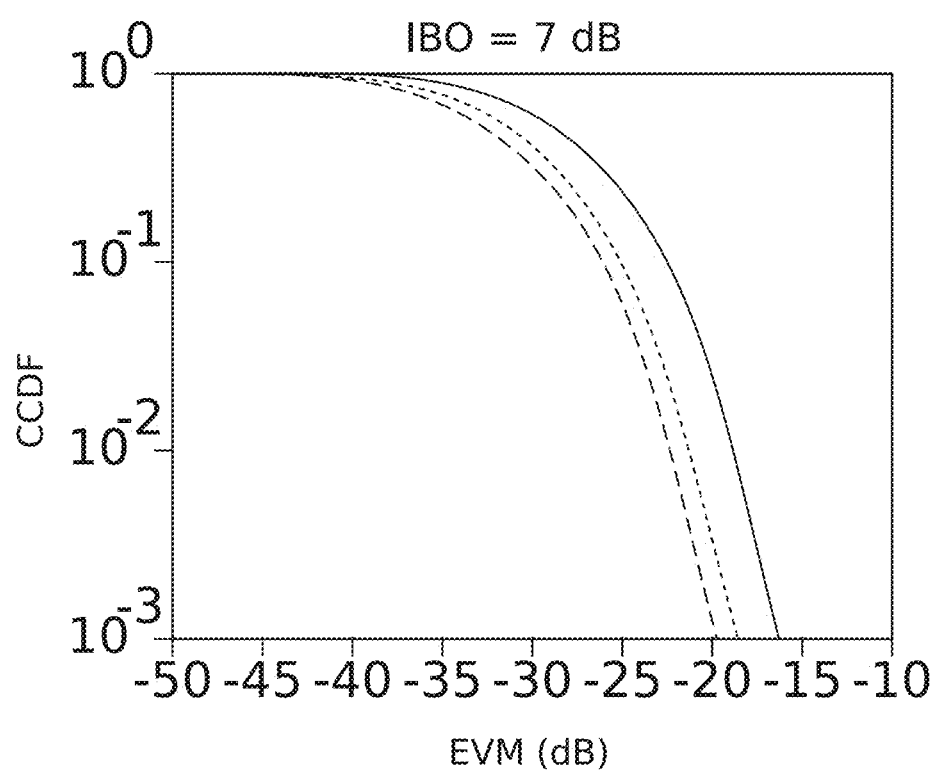
FIG. 10 illustrates graphically the complementary cumulative distribution function (CCDF) evolutions in function of error vector magnitude (EVM) for i) signals transmitted without implementing the method according to the first aspect of the present invention, ii) signals transmitted by implementing the method according to a first variant of the present invention, iii) signals transmitted by implementing the method according to a second variant of the present invention.

Furthermore, FIG. 10 shows the evolution of the complementary cumulative distribution function (CCDF) in function of error vector magnitude (EVM) for i) signals transmitted without implementing the method according to the first aspect of the present invention (full curve), ii) signals transmitted by implementing the method according to the first setting mode (short dashes curve), iii) signals transmitted by implementing the method according to the second setting mode (long dashes curve). This shows, for a given IBO, the gain achieved in terms of EVM owing to an embodiment of the digital pre-distortion method according to the invention, and the gain achieved in terms of EVM when considering weight mode 2 instead of weight mode 1.

Other applications that the one relative to WiFi communications comprise digital audio broadcasting (DAB) and terrestrial digital video broadcasting (DVB-T). Other applications are foreseeable in the framework of Long-Term Evolution (LTE) standard for wireless broadband communication for mobile devices and data terminals.

The particular implementations shown and described herein are illustrative examples of the invention and are not intended to otherwise limit the scope of the invention in any way.

What is claimed is:

1. A digital pre-distortion method for OFDM-based communication system, wherein a transmitter is designed to transmit an OFDM symbol comprised of a set of $N_{FFT}$ complex symbols $\{s_k\}$, with each complex symbol $s_k$ being intended to be transmitted onto a single subcarrier k among a set of $N_{FFT}$ sub-carriers, with each complex symbol $s_k$ being modulated according to a determined Modulation Coding Scheme (MCS) among a plurality of implementable MCSs and each subcarrier k belonging to a subset of said $N_{FFT}$ sub-carriers among a plurality of predetermined subsets, said transmitter being designed to consult a set of data tables, wherein each data table is predetermined for one determined of said implementable MCSs and wherein each table comprising a plurality of weighting coefficients, with each weighting coefficient being associated to a determined subset of subcarriers, the method comprising the following steps, after a so-called frequency mapping step for generating said set of $N_{FFT}$ complex symbols $\{s_k\}$ of the OFDM symbol:
1) Compute a Peak-to-Average Power Ratio (PAPR) of the OFDM symbol,
2) If the computed PAPR is larger than a predetermined threshold value:
   a) For at least one complex symbol $s_k$, compute a vector metric $M_k$, with said vector metric $M_k$ measuring the contribution of the subcarrier k to the computed Peak-to-Average Power Ratio, and
   b) For said at least one complex symbol $s_k$, determine a weighting coefficient $W_k$ by consulting the one of said data tables which is predetermined for the MCS according to which said at least one complex symbol $s_k$ is modulated and with said weighting coefficient $W_k$ being associated in the data table with the determined subset to which belongs the subcarrier k onto which said at least one complex symbol $s_k$ is intended to be transmitted, then
   c) For said at least one complex symbol $s_k$, compute an error signal $e_k$ in function of the computed vector metric $M_k$ and the determined weighting coefficient $W_k$, and
   d) For said at least one complex symbol $s_k$, compute a perturbed complex symbol $\bar{s}_k$ in function of said at least one complex symbol $s_k$ and the computed error signal $e_k$, then
3) Generate a perturbed set of $N_{FFT}$ complex symbols $\{\bar{s}_k\}$ by replacing, in said set of $N_{FFT}$ complex symbols $\{s_k\}$, each of said at least one complex symbol $s_k$ by the computed perturbed complex symbol $\bar{s}_k$ which corresponds thereto, then
4) Perform an $N_{FFT}$-point Inverse Fast Fourier Transform (IFFT) to the perturbed set of $N_{FFT}$ complex symbols $\{\bar{s}_k\}$, for generating a corresponding set of time-domain samples $\{\bar{t}_k\}$ to be pushed, through a power amplifier (PA) of the transmitter, towards radiofrequency (RF) transmission.

2. The method according to claim 1, wherein each data table of said set of data tables is predetermined, for at least one determined of said implementable MCSs, by:
   i) Considering an Input Back Off (IBO) value strictly inferior to the smallest value for which requirements in terms of Error Vector Magnitude (EVM) and/or spectral mask are fulfilled for said set of $N_{FFT}$ complex symbols $\{s_k\}$,
   ii) Implementing steps 1) to 4) with a heuristically defined set of test values for said plurality of weighting coefficients,
   iii) Computing an EVM and a spectral distribution function resulting from said Input Back Off (IBO) value and said heuristically defined set of test values for said plurality of weighting coefficients,
   iv) If the resulting EVM and/or the resulting spectral distribution function still fulfill the requirements in terms of EVM and spectral mask, then putting said set of test values and the considered IBO value in the data table associated with said one determined of said implementable MCSs as said plurality of weighting coefficients and an optimized IBO value respectively,
   v) If the resulting EVM and/or the resulting spectral distribution function do not fulfill the requirements in terms of EVM and spectral mask, change said set of test values and/or said considered IBO value and repeat steps ii) and iii) until finding a set of test values and/or an IBO value for which the requirements in terms of EVM and spectral mask are fulfilled so as to put iv) this set of test values and the considered IBO value in the data table associated with said one determined of said implementable MCSs as said plurality of weighting coefficients and an optimized IBO value respectively.

3. The method according to claim 2, wherein the transmitter is configured to transmit said OFDM symbol with the considered Input Back Off value.

4. The method according to claim 1, wherein, with said set of $N_{FFT}$ sub-carriers being of frequencies different from each other, said frequencies belonging to a predetermined frequency range, said plurality of predetermined subsets is chosen as comprising at least one first subset of subcarriers of frequencies dedicated to be used in accordance with spectral mask requirement, said frequencies being called in-band frequencies, and at least one second subset for subcarriers of frequencies dedicated to be unused in accordance with said spectral mask requirement, said frequencies being called out-of-band frequencies.

5. The method according to claim 4, wherein said plurality of predetermined subsets is chosen as comprising a data subset for data symbols, a pilot subset for pilot symbols, a Direct Current (DC) subset for the subcarriers whose frequencies are centered relative to said predetermined frequency range, a side subset for first subcarriers on each side of said in-band frequencies, and an outside subset for others subcarriers among said $N_{FFT}$ subcarriers.

6. The method according to claim 2, wherein the heuristically defined set of test values obeys the following rules, with said MCSs resulting in different data rates:
   If said at least one determined of said implementable MCSs is the one resulting in a weaker data rate, then define the set of test values with non-zero test values for subcarriers of in-band frequencies and with null test values for subcarriers of out-of-band frequencies,
   If said at least one determined of said implementable MCSs is the one resulting in a larger data rate, then define the set of test values with null test values for subcarriers of in-band frequencies and with non-zero test values for the subcarriers of out-of-band frequencies, and
   If said at least one determined of said implementable MCSs is neither the one resulting in a weaker data rate, nor the one resulting in a larger data rate, foreseen to define the set of test values with non-zero test values for subcarriers of in-band and out-of-band frequencies.

7. The method according to claim 2, wherein the heuristically defined set of test values obeys at least one of the following rules:
   The error signals $e_k$ for perturbing complex symbols intended to be transmitted onto subcarriers belonging to a data subset are computed as a function of the EVM requirement,
   The error signals $e_k$ for perturbing complex symbols intended to be transmitted onto subcarriers belonging to side and outside subsets are computed as a function of the spectral mask requirement,
   The error signals $e_k$ for perturbing complex symbols intended to be transmitted onto subcarriers belonging to a pilot subset are computed in order to not change a phase of said complex symbols, and
   The error signals $e_k$ for perturbing complex symbols intended to be transmitted onto subcarriers belonging to a DC subset are computed in order to avoid burst power phenomena.

8. The method according to claim 1, wherein step a) is performed for each complex symbol $s_k$ and steps b) to d) are performed for a set of complex symbols $s_k$ for each of which the computed vector metric $M_k$ is larger than a second predetermined threshold value or for a set of complex symbols $s_k$ of fixed cardinal number K for which the computed vector metrics are the bigger among all the computed vector metrics.

9. The method according to claim 1, wherein step a) comprises:

Implement an $N_{FFT}$-point IFFT to said set of $N_{FFT}$ complex symbols $\{s_k\}$ to obtain discrete time-domain samples $\{t_n\}$ of said $N_{FFT}$ complex symbols $\{s_k\}$, For said at least one complex symbol $s_k$, compute the vector metric $M_k$ according to $$M_k = -\sum_{n \in K} t_n |t_n|^p e^{-2j\pi nk/N_{FFT}},$$

where K is a subset of $N_{FFT}$ elements in $\{t_n\}$ with by default $K=\{1 \ldots N_{FFT}\}$, and where p>1 is a user defined parameter, usually p=3 or 4.

10. The method according to claim 1, wherein step c) consists in multiplying the computed vector metric $M_k$ by the determined weighting coefficient $W_k$.

11. The method according to claim 1, wherein step d) consists in adding the computed error signal $e_k$ to said at least one complex symbol $s_k$.

12. The method according to claim 1, wherein the OFDM-based communication system is a WiFi communication system.

13. The method according to claim 12, wherein each of said $N_{FFT}$ complex symbols $\{s_k\}$ is modulated by using one among Phase-Shift Keying (PSK) modulation and Quadrature Amplitude Modulation (QAM).

14. A non-transitory computer readable medium storing instructions which, when implemented by at least one digital processing device, performs at least the steps 1) to 4) of the method according to claim 1.

15. A transmitter of an OFDM-based communication system, wherein said transmitter is configured to implement at least the steps 1) to 4) of the method according to claim 1.

16. The method according to claim 5, wherein a heuristically defined set of test values obeys at least one of the following rules:

The error signals $e_k$ for perturbing complex symbols intended to be transmitted onto subcarriers belonging to said data subset are computed as a function of an EVM requirement, The error signals $e_k$ for perturbing complex symbols intended to be transmitted onto subcarriers belonging to side and outside subsets are computed as a function of the spectral mask requirement, The error signals $e_k$ for perturbing complex symbols intended to be transmitted onto subcarriers belonging to a pilot subset are computed in order to not change a phase of said complex symbols, and The error signals $e_k$ for perturbing complex symbols intended to be transmitted onto subcarriers belonging to said DC subset are computed in order to avoid burst power phenomena.

\* \* \* \* \*